United States Patent
Omoto et al.

(10) Patent No.: US 7,176,612 B2
(45) Date of Patent: Feb. 13, 2007

(54) LED DEVICE AND PORTABLE TELEPHONE, DIGITAL CAMERA AND LCD APPARATUS USING THE SAME

(75) Inventors: Masatoshi Omoto, Osaka (JP); Masatsugu Masuda, Yamatotakada (JP); Masaharu Kitano, Kitakatsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 10/830,379

(22) Filed: Apr. 21, 2004

(65) Prior Publication Data

US 2004/0207313 A1   Oct. 21, 2004

(30) Foreign Application Priority Data

Apr. 21, 2003 (JP) .............................. 2003-115987

(51) Int. Cl.
*H01L 27/15* (2006.01)
*H01L 29/26* (2006.01)

(52) U.S. Cl. .................. 313/487; 313/468; 257/80; 257/84

(58) Field of Classification Search ............... 313/487, 313/468; 257/80, 84
See application file for complete search history.

(56) References Cited

U.S. PATENT DOCUMENTS 6,234,648 B1 *  5/2001  Borner et al. ............... 362/235

2003/0122482 A1 *  7/2003  Yamanaka et al. .......... 313/512
2004/0245532 A1     12/2004  Maeda et al.

FOREIGN PATENT DOCUMENTS

| CN | 1228618 A | 9/1999 |
|---|---|---|
| CN | 1289456 A | 3/2001 |
| JP | 2000-275636 A | 10/2000 |
| JP | 2002-060747 | 2/2002 |
| JP | 2002-064220 | 2/2002 |
| JP | 2002-203989 | 7/2002 |
| WO | WO-00/33390 A1 | 6/2000 |
| WO | WO-03/032407 A1 | 4/2003 |

* cited by examiner

*Primary Examiner*—Nimeshkumar D. Patel
*Assistant Examiner*—Peter Macchiarolo
(74) *Attorney, Agent, or Firm*—Morrison & Foerster LLP (57) ABSTRACT

An LED device at least including a blue light emitting element having peak emission wavelength of 420 nm to 480 nm, a green fluorescent substance having peak wavelength of fluorescent spectrum in the range of 500 nm to 580 nm with the emission of the blue light emitting element, and a red light emitting element having peak emission wavelength of 600 nm to 670 nm is provided. The device may further include an ultraviolet/violet light emitting element for exciting green fluorescent substance. As a result, an LED device capable of attaining bright white light with good color reproduction characteristic is provided.

6 Claims, 12 Drawing Sheets

LED DEVICE AND PORTABLE TELEPHONE, DIGITAL CAMERA AND LCD APPARATUS USING THE SAME

This nonprovisional application is based on Japanese Patent Application No. 2003-115987 filed with the Japan Patent Office on Apr. 21, 2003, the entire contents of which are hereby incorporated by reference.

BACKGROUND OF THE INVENTION

1. Field of the Invention

The present invention relates to an LED (Light Emitting Diode) device used as an auxiliary light source of a CCD (charge coupled device) or a CMOS (Complementary Metal Oxide Semiconductor) camera or as a backlight source of an LCD (Liquid Crystal Display). More specifically, the present invention relates to an LED device having superior color reproduction characteristic and emitting bright white light, including a combination of a light emitting element and a fluorescent substance excited by the light emitting element.

2. Description of the Background Art

As a conventional white light emitting device using an LED, a white LED device has been known (see, for example, Japanese Patent Laying-Open No. 2002-064220), which includes a combination of a blue light emitting element having peak emission wavelength of about 460 nm and a YAG based fluorescent substance emitting yellow fluorescent light excited by the blue light emitting element, emitting white light as a mixed emission of blue and yellow light.

The white LED device described above, however, attains quasi-white emission by the combination of blue light and fluorescent light of yellow as a complementary color of blue, and therefore, color reproduction characteristic of red, in particular, has been unsatisfactory.

As another example, a white LED device including a combination of LEDs having peak emission wavelengths of red, green and blue as three primary colors of light, for emitting white light as a mixed emission has also been known.

In such a white LED device, however, peak emission width of each light emitting element is narrow, and therefore, it has been difficult to attain bright white light with satisfactory color reproduction characteristic.

SUMMARY OF THE INVENTION

The present invention was made in order to solve the above described problem, and its object is to provide an LED device having good color reproduction characteristic and attaining bright white light.

According to an aspect, the present invention provides an LED device including at least a blue light emitting element having peak emission wavelength of 420 nm to 480 nm, a green fluorescent substance having peak wavelength of fluorescent spectrum in the range of 500 nm to 580 nm with the emission of the blue light emitting element, and a red light emitting element having peak emission wavelength of 600 nm to 670 nm. According to another aspect, the present invention provides an LED device including at least a blue light emitting element having peak emission wavelength of 420 nm to 480 nm, an ultraviolet/violet light emitting element having peak emission wavelength of 360 nm to 420 nm, a green fluorescent substance having peak wavelength of fluorescent spectrum in the range of 500 nm to 580 nm at least with the emission of the ultraviolet/violet light emitting element, and a red light emitting element having peak emission wavelength of 600 nm to 670 nm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
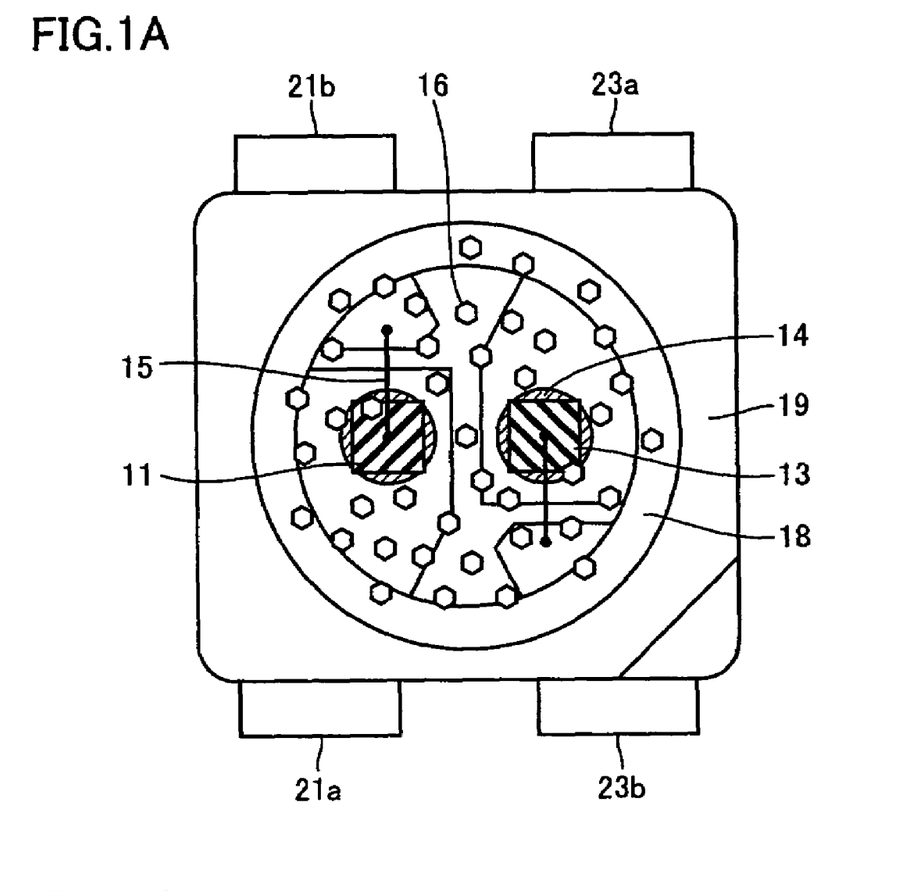
FIG. 1A is a schematic plan view of an LED device in accordance with the present invention.
Figure 1B:
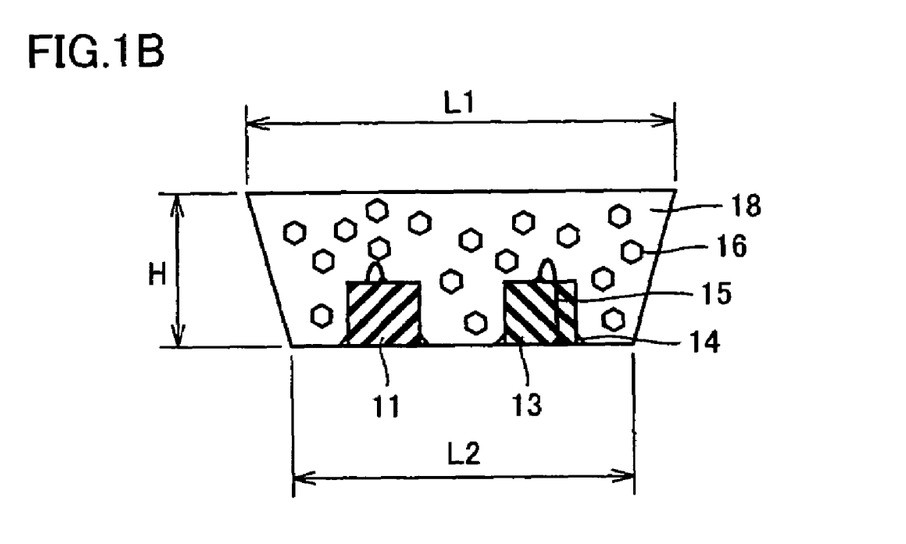
FIG. 1B is a schematic illustration of a main portion seen through one side of the LED device.

Referring to FIGS. 1A and 1B, an LED device in accordance with the present invention at least includes a blue light emitting element 11 having peak emission wavelength of 420 nm to 480 nm, a green fluorescent substance 16 having peak wavelength of fluorescent spectrum in the range of 500 nm to 580 nm with the emission of the blue light emitting element 11, and a red light emitting element 13 having peak emission wavelength of 600 nm to 670 nm. In the present invention, peak wavelength refers to the maximum peak wavelength of the spectrum of interest.

Referring to FIGS. 1A and 1B, blue light emitting element 11 is attached to a terminal electrode 21a by means of conductive adhesive 14 and conducted to a terminal electrode 21b by means of a bonding wire 15, while red light emitting element 13 is attached to a terminal electrode 23a by means of conductive adhesive 14 and conducted to a terminal electrode 23b by means of a bonding wire 15. Blue light emitting element 11, red light emitting element 13 and green fluorescent substance 16 are sealed by a light-transmitting resin 18. Here, terminal electrodes 21a, 21b, 23a and 23b are integrally formed with a reflective case 19, providing an outer housing of the LED device.

Blue light emitted from blue light emitting element 11 that excites green fluorescent substance 16 sealed in light-transmitting resin 18 is converted to green fluorescent light, and transmitted to the outside through light-transmitting resin 18. Blue light emitted from blue light emitting element 11 that does not excite green fluorescent substance 16 is also transmitted to the outside through light-transmitting resin 18. Further, red light emitted from red light emitting element is also transmitted to the outside through light-transmitting resin 18 without exciting green fluorescent substance 16. Specifically, the combination of blue light from blue light emitting element 11, green light from green fluorescent substance 16 and red light from red light emitting element 13 realizes white light with good color reproduction characteristic.

There is no restriction on light-transmitting resin 18 as far as the objects of the present invention are attained, and thermosetting epoxy resin, silicone resin, acrylic resin, polycarbonate resin or polypropylene resin may be used.

Figure 2A:
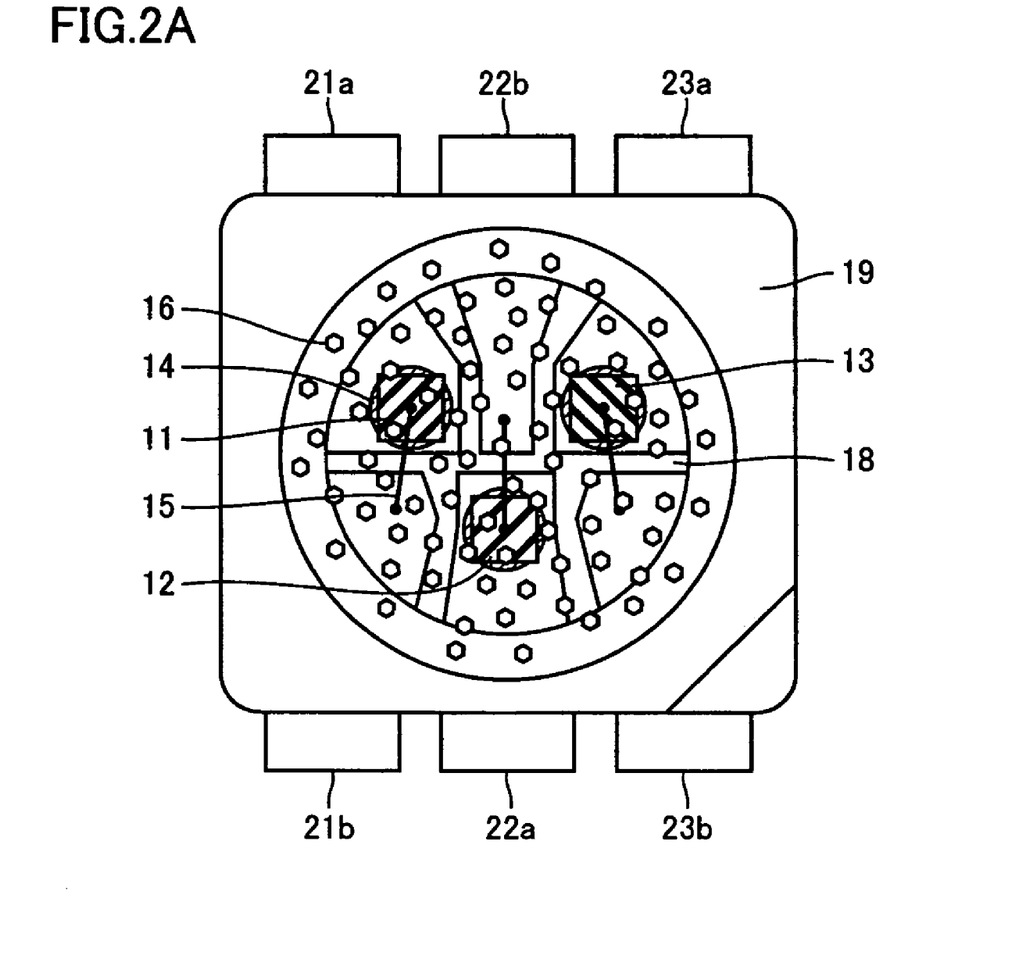
FIG. 2A is a schematic plan view of another LED device in accordance with the present invention.
Figure 2B:
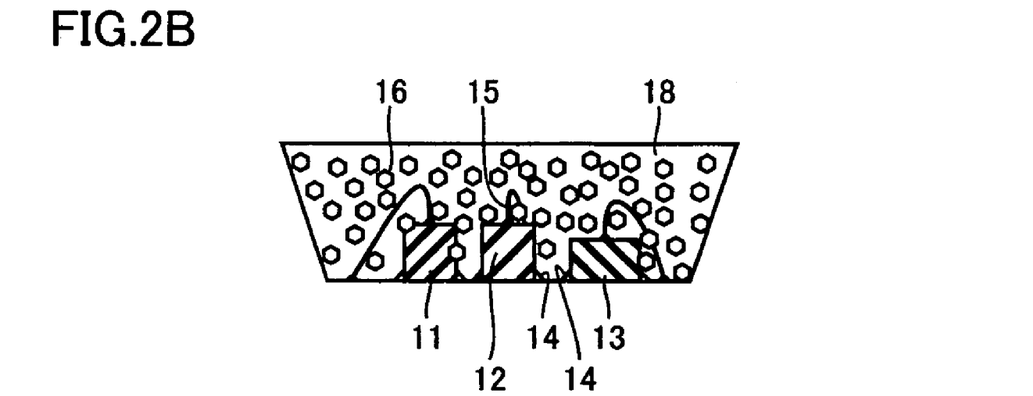
FIG. 2B is a schematic illustration of a main portion seen through one side of the LED device.

Referring to FIGS. 2A and 2B, another LED device in accordance with the present invention at least includes a blue light emitting element 11 having peak emission wavelength of 420 nm to 480 nm, an ultraviolet/violet light emitting element 12 having peak emission wavelength of 360 nm to 420 nm, a green fluorescent substance 16 having peak wavelength of fluorescent spectrum in the range of 500 nm to 580 nm at least with the emission of the ultraviolet/violet light emitting element 12, and a red light emitting element 13 having peak emission wavelength of 600 nm to 670 nm. Similar to the LED device shown in FIGS. 1A and 1B, the LED device shown in FIGS. 2A and 2B realizes white light with good color reproduction characteristic by the combination of blue light from blue light emitting element 11, green light from green fluorescent substance 16 and red light from red light emitting element 13.

The LED device shown in FIGS. 2A and 2B employs blue light emitting element 11 for emitting blue light and ultraviolet/violet light emitting element 12 for exciting green fluorescent substance 16 emitting green light, and in this point it is different from the LED device shown in FIGS. 1A and 1B that employs only the blue light emitting element 11 both for emitting blue light and for exciting green fluorescent substance 16 to emit green light. Here, when a green fluorescent substance that is excited only by ultraviolet/violet light emitting element 12 and not excited by blue light emitting element 11 is used as green fluorescent substance 16, blue light is obtained by emission of blue light emitting element 11, green light is obtained by green fluorescent substance 16 excited by the emission of ultraviolet/violet light emitting element 12, and red light is obtained by emission of red light emitting element 13, independently from each other, and therefore, light of an arbitrary color can be obtained by adjusting the intensity of light emission from each of the light emitting elements.

In FIGS. 2A and 2B, in place of ultraviolet/violet light emitting element 12 for exciting green fluorescent substance 16, a blue light emitting element (not shown) for exciting green fluorescent substance 16 may be used. In that case, a green fluorescent substance that is excited by the blue light emitting element is used.

Figure 3A:
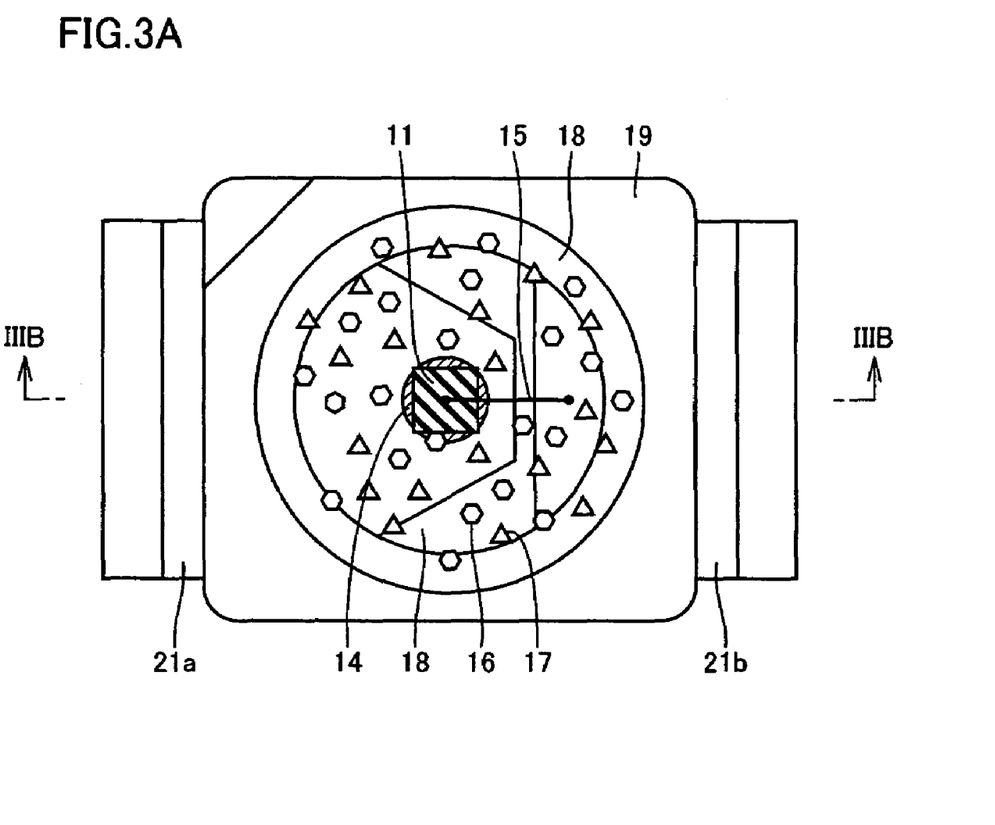
FIG. 3A is a schematic plan view of still another LED device in accordance with the present invention.
Figure 3B:
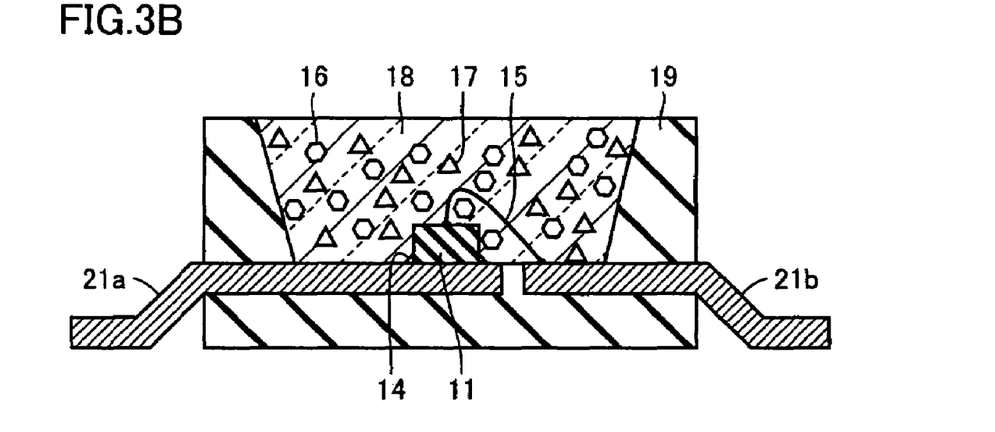
FIG. 3B is a schematic sectional view of a main portion of the LED device taken along the line IIIB—IIIB of FIG. 3A.

Referring to FIGS. 3A and 3B, a further LED device in accordance with the present invention at least includes a blue light emitting element having peak emission wavelength of 420 nm to 480 nm, a green fluorescent substance 16 having peak wavelength of fluorescent spectrum in the range of 500 nm to 580 nm with the emission of the blue light emitting element, and a red fluorescent substance 17 having peak wavelength of fluorescent spectrum in the range of 600 nm to 670 nm with the emission of the blue light emitting element. The combination of blue light from blue light emitting element 11, green light from green fluorescent substance 16 and red light from red fluorescent substance 17 realizes white light with good color reproduction characteristic.

Figure 4A:
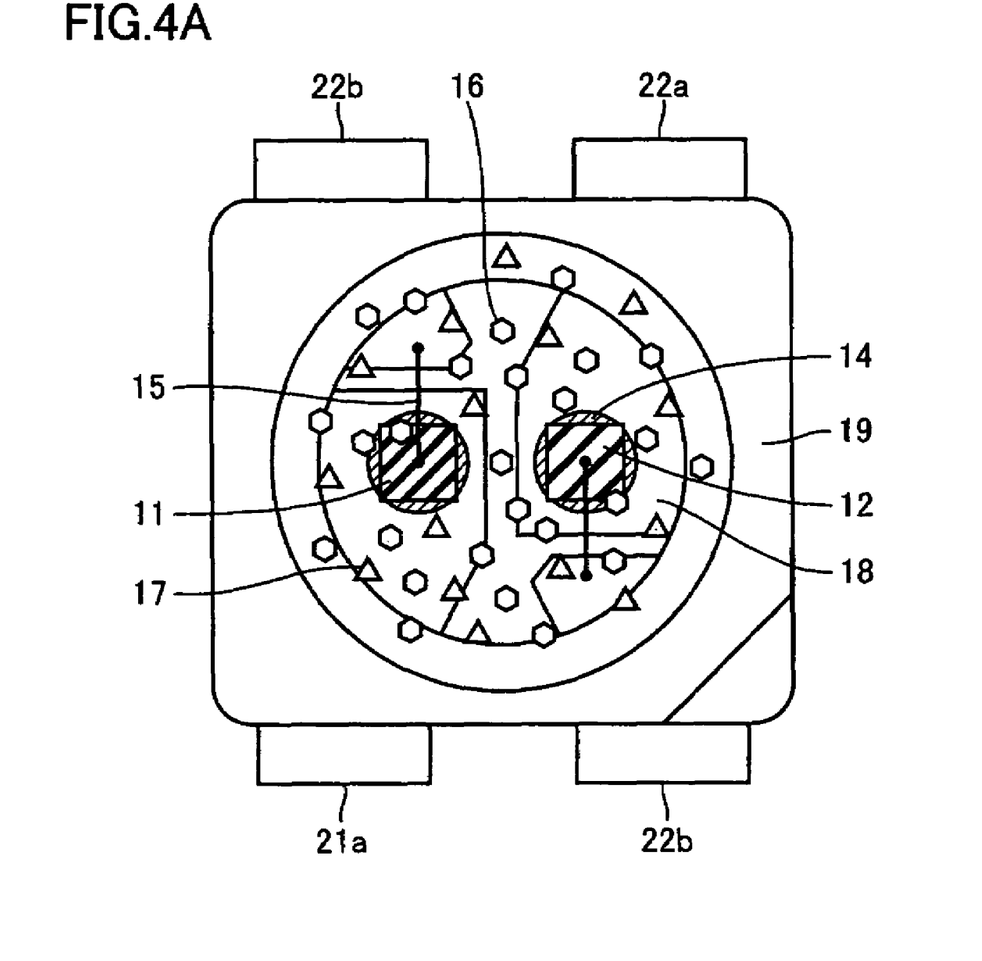
FIG. 4A is a schematic plan view of a still further LED device in accordance with the present invention.
Figure 4B:
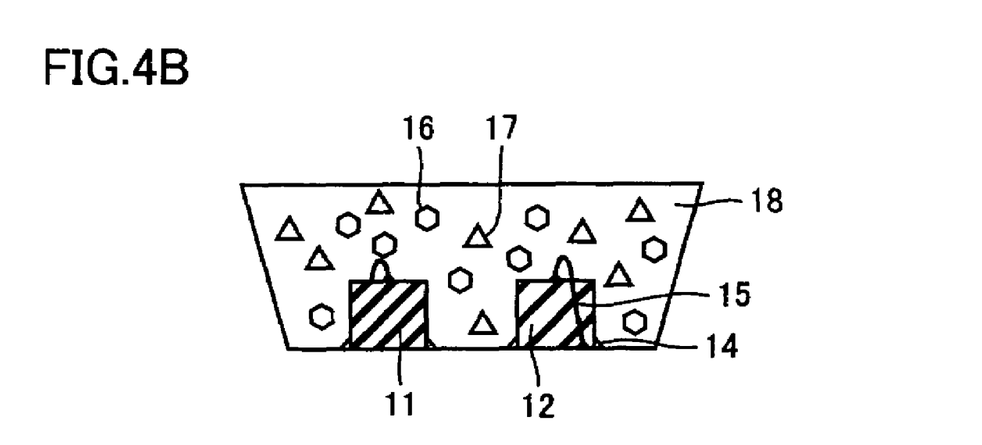
FIG. 4B is a schematic illustration of a main portion seen through one side of the LED device.

Referring to FIGS. 4A and 4B, a still further LED device in accordance with the present invention at least includes a blue light emitting element 11 having peak emission wavelength of 420 nm to 480 nm, an ultraviolet/violet light emitting element 12 having peak emission wavelength of 360 nm to 420 nm, a green fluorescent substance 16 having peak wavelength of fluorescent spectrum in the range of 500 nm to 580 nm at least with the emission of the ultraviolet/violet light emitting element 12, and a red fluorescent substance 17 having peak wavelength of fluorescent spectrum in the range of 600 nm to 670 nm at least with the emission of the ultraviolet/violet light emitting element 12. The combination of blue light from blue light emitting element 11, green light from green fluorescent substance 16 and red light from red fluorescent substance 17 realizes white light with good color reproduction characteristic.

In FIGS. 4A and 4B, in place of ultraviolet/violet light emitting element 12 for exciting green fluorescent substance 16, a blue light emitting element (not shown) for exciting green fluorescent substance 16, may be used. In that case, a green fluorescent substance that is excited by the blue light emitting element is used.

In the LED device in accordance with the present invention, there is no restriction on the red fluorescent substance as far as the objects of the present invention are attained, and preferably, a fluorescent substance $Sr_xCa_{1-x}S$:Eu having $Sr_xCa_{1-x}S$ ($0 \leq x \leq 1$) as a base material and Eu as an activator may be used, because such a red fluorescent substance attains high fluorescent luminous intensity.

Further, there is no restriction on the green fluorescent substance as far as the objects of the present invention are attained, and preferably, at least one fluorescent substance may be used that is selected from the group of fluorescent substances consisting of: $SrGa_2S_4$:Eu; $RMg_2Al_{16}O_{27}$:Eu, Mn (R is at least one element selected from Sr and Ba); $RMgAl_{10}O_{17}$:Eu, Mn (R is at least one element selected from Sr and Ba); ZnS:Cu; $SrAl_2O_4$:Eu; $SrAl_2O_4$:Eu, Dy; ZnO:Zn; $Zn_2Ge_2O_4$:Mn; $Zn_2SiO_4$:Mn; and $Q_3MgSi_2O_8$:Eu, Mn (Q is at least one element selected from Sr, Ba and Ca), because such a green fluorescent substance attains high fluorescent luminous intensity. Use of two or more green fluorescent substances is preferable, as the green range of fluorescent spectrum becomes broader, enabling white light with better color reproduction characteristic.

Figure 5A:
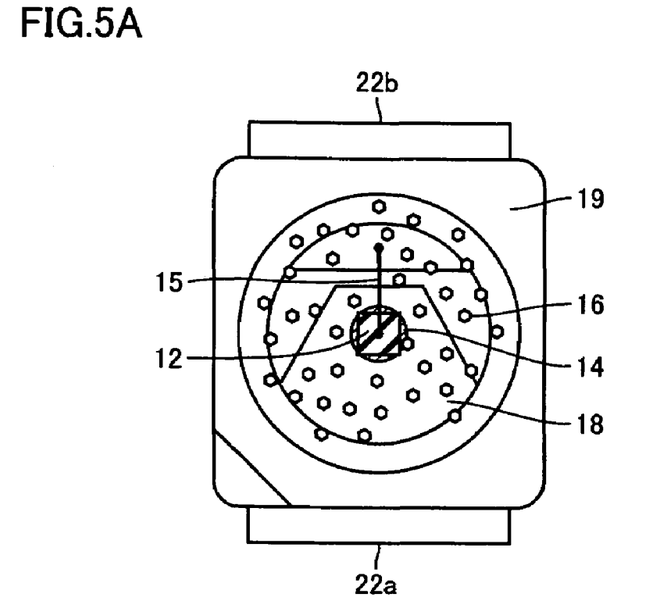
FIG. 5A is a schematic plan view of an LED device including an ultraviolet/violet light emitting element and a green fluorescent substance.
Figure 5B:
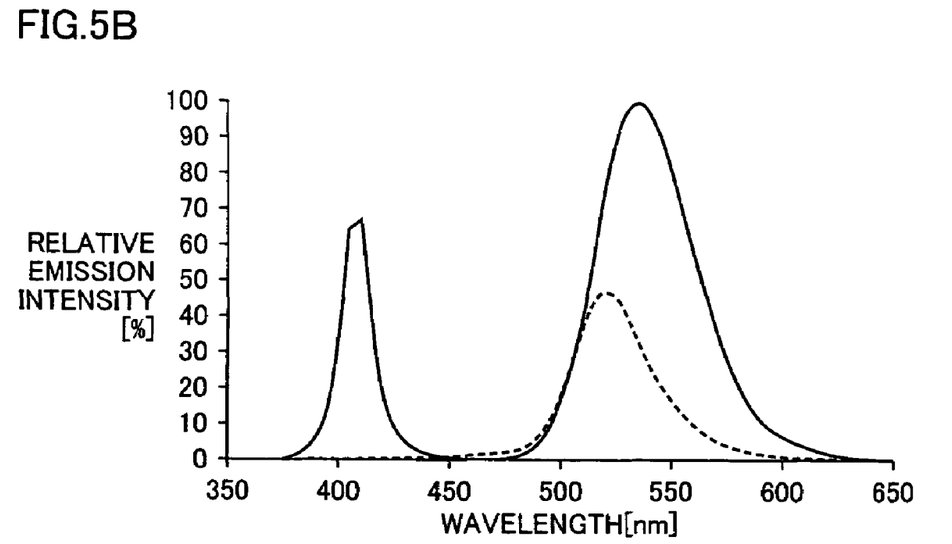
FIG. 5B represents emission spectra of the LED device and of the green light emitting element.

It is particularly preferred that at least a fluorescent substance SrGaS:Eu having SrGaS as a base material and Eu as an activator is contained in the green fluorescent substance, as fluorescent luminous intensity thereof is particularly high. Representative example of SrGaS:Eu fluorescent substance includes $SrGa_2S_4$:Eu. FIG. 5A shows an LED device including ultraviolet/violet light emitting element 12 and green fluorescent substance 16, in which a violet light emitting element (GaN, peak emission wavelength: 405 nm) is used as ultraviolet/violet light emitting element 12, and $SrGa_2S_4$:Eu is used as green fluorescent substance 16. FIG. 5B shows, in a solid line, emission spectrum of the LED device of FIG. 5A, when energized with 35 mA. For comparison, FIG. 5B shows, in a dotted line, emission spectrum of a green light emitting element (InGaN, peak emission wavelength: 525 nm) when energized with 35 mA. Luminous intensity in axial direction of the present LED device is 2 cd, providing much brighter green light than the green light emitting element having the luminous intensity in axial direction of 0.8 cd. The spectral width in green range of the present LED device is significantly wider than that of the green light emitting element, and therefore, it can be understood that white light with better color reproduction characteristic can be obtained by the combination with blue and red light emitting elements.

It is preferred that at least a fluorescent substance SrAlO:Eu having SrAlO as a base material and Eu as an activator is contained in the green fluorescent substance, as it has high fluorescent luminous intensity. Representative example of SrAlO:Eu fluorescent substance includes $SrAl_2O_4$:Eu. It is noted that fluorescent substance $SrAl_2O_4$:Eu is excited by an ultraviolet/violet light emitting element having the peak emission wavelength of 360 nm to 420 nm, while it is hardly excited by a blue light emitting element having the peak emission wavelength of 420 nm to 480 nm. Therefore, in the LED device shown in FIGS. 2A and 2B, for example, when $SrAl_2O_4$:Eu only is used as the green fluorescent substance, blue light is obtained by the emission of the blue light emitting element, green light is obtained from the green fluorescent substance excited by the ultraviolet/violet light emitting element and red light is obtained by the emission of red light emitting element, independently from each other, and hence, light of an arbitrary color can be obtained by adjusting intensity of emission from each of the light emitting elements.

In the foregoing, expressions such as SrGaS and SrAlO without suffixes representing number of elements generally refer to the overall compound consisting of these elements, and representative examples of these compounds include $SrGa_2S_4$ and $SrAl_2O_4$.

Preferably, the fluorescent substance (both green and red) has light transmitting characteristic and refractive index n of $n>1$. As the fluorescent substance transmits light, the light emitted from the light emitting element is not reflected by the fluorescent substance, and as the refractive index is set to $n>1$, the light emitted from the light emitting element can efficiently be collected to the fluorescent substance. Further, it is preferred that the fluorescent substance is coated with a heat-resistant, water-proof and light transmitting coating. Such treatment is preferred as the fluorescent substance, particularly a sulfide such as $SrGa_2S_4$:Eu tends to absorb water and be deactivated. Coating of the fluorescent substance with a heat-resistant, water-proof and light transmitting coating refers to covering, or making a microcapsule of, the fluorescent substance with a heat-resistant, water-proof and light transmitting material. By way of example, it may be silazane processing or coverage with a glass material such as borosilicate. Here, silazane processing refers to a coating of the surface of fluorescent substance, by dissolving a silazane having an Si—N bond, for example, perhydrosilazane in a solvent, applying the same to the surface of the fluorescent substance and curing or sintering the same in the atmosphere.

Preferably, grain size of the fluorescent substance is at most 20 μm. With this size, the fluorescent substance maintains its light transmitting characteristic, and efficiency of fluorescence of the fluorescent substance can be improved as specific surface becomes larger.

In the LED device in accordance with the present invention, the blue light emitting element and the green fluorescent substance may be arranged such that the blue light emitting element as the emission light source of blue light does not excite the green fluorescent substance. The arrangement of the blue light emitting element and the green fluorescent substance is not specifically limited as long as the excitation of the green fluorescent substance by the blue light emitting element is prevented. By way of example, arrangements such as shown in FIGS. 6B, 7B and 8 may be adopted.

Figure 6A:
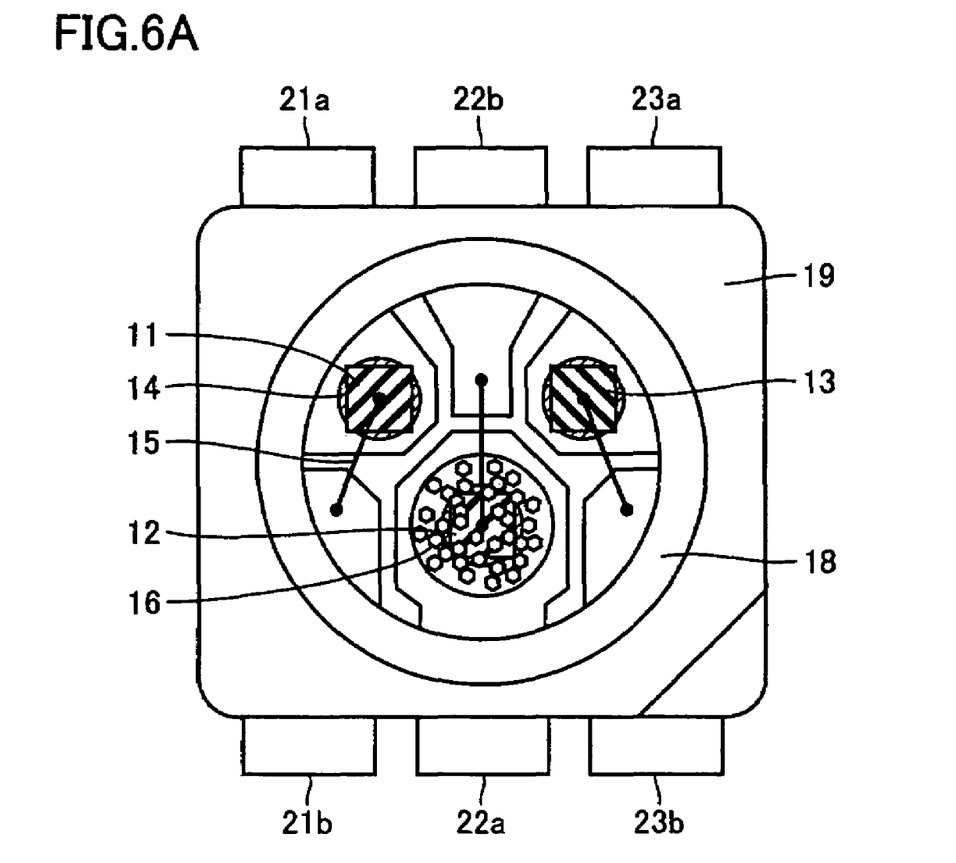
FIG. 6A is a schematic plan view of a still further LED device in accordance with the present invention.
Figure 6B:
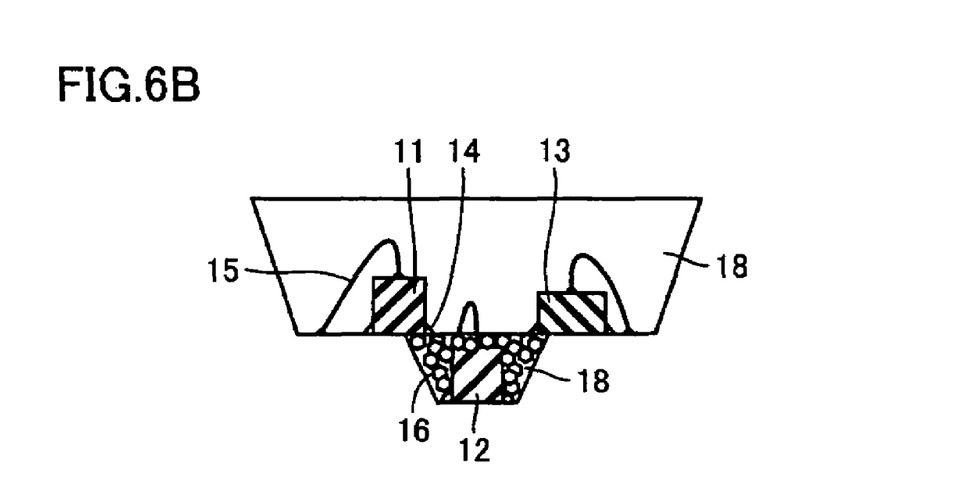
FIG. 6B is a schematic illustration of a main portion seen through one side of the LED device.

In the LED device shown in FIGS. 6A and 6B, green fluorescent substance 16 is locally placed only around ultraviolet/violet light emitting element 12 for exciting green fluorescent substance 16, and ultraviolet/violet light emitting element 12 and green fluorescent substance 16 are confined in a space lower than the plane on which blue light emitting element 11 as an emission source of blue light and red light emitting element 13 as an emission source of red light are positioned, so that light emitted from blue light emitting element as the emission light source is not directed to green fluorescent substance 16.

Figure 7A:
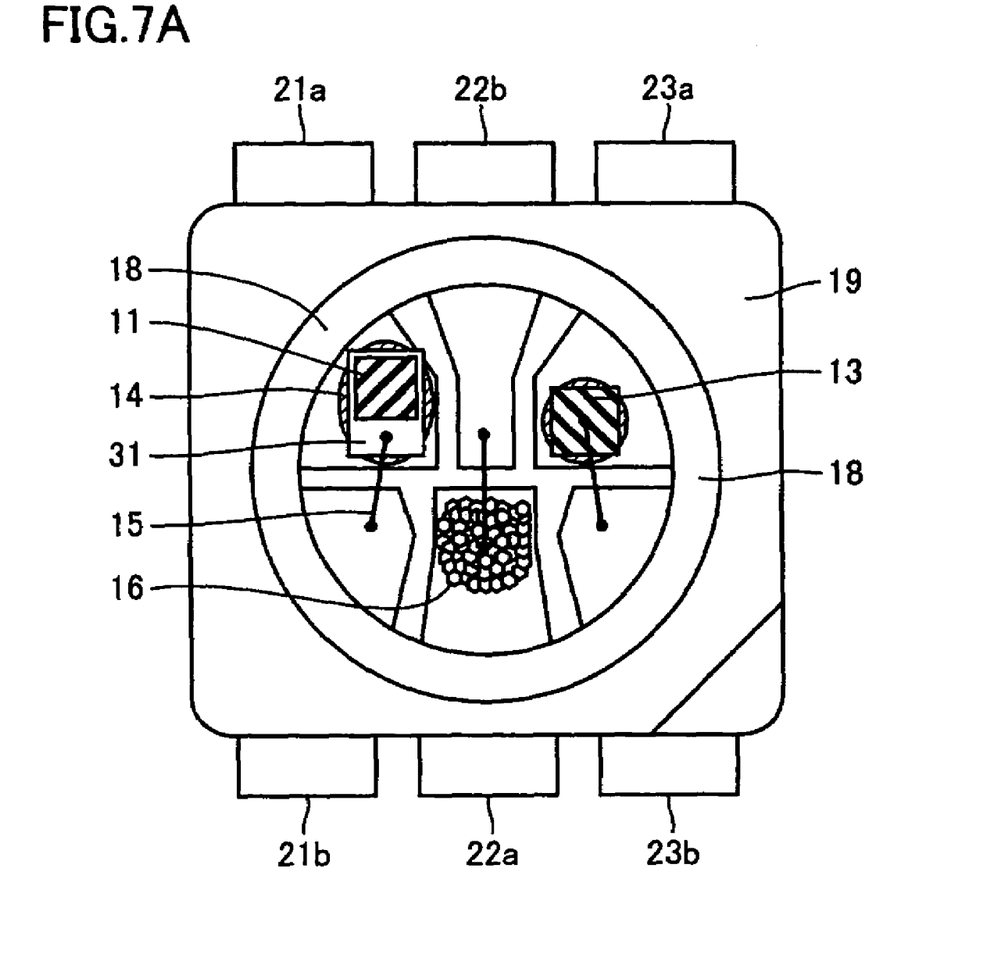
FIG. 7A is a schematic plan view of a still further LED device in accordance with the present invention.
Figure 7B:
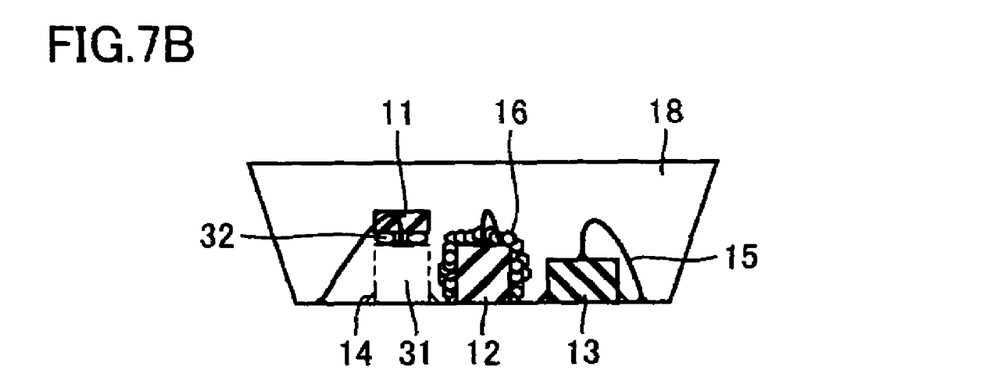
FIG. 7B is a schematic illustration of a main portion seen through one side of the LED device.

In the LED device shown in FIGS. 7A and 7B, green fluorescent substance 16 is locally placed only around ultraviolet/violet light emitting element 12 for exciting green fluorescent substance 16, and blue light emitting element 11 as an emission source of blue light is positioned on a silicon base 31 with an electrode bump 32 interposed. In this manner, blue light emitting element 11 is positioned higher than the plane on which ultraviolet/violet light emitting element 12, green fluorescent substance 16 and red light emitting element 13 are positioned, so that light emitted from blue light emitting element as the emission light source is not directed to green fluorescent substance 16.

Figure 8:
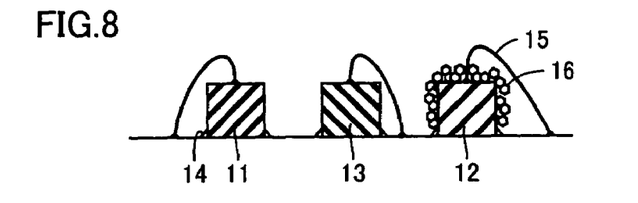
FIG. 8 illustrates arrangement of the blue light emitting element and the green fluorescent substance in an LED device in accordance with the present invention.

Further, as shown in FIG. 8, even when blue light emitting element 11 as an emission source of blue light, red light emitting element 13 as an emission source of red light, ultraviolet/violet light emitting element 12 for exciting green fluorescent substance 16 and green fluorescent substance 16 are arranged on one same plane, light emitted from blue light emitting element 11 can be prevented from entering green fluorescent substance 16 by arranging these on one line.

In FIGS. 6B, 7B and 8, in place of ultraviolet/violet light emitting element 12 for exciting green fluorescent substance 16, a blue light emitting element (not shown) for exciting green fluorescent substance 16 may be used.

As described above, as the blue light emitting element and the green fluorescent substance are arranged to prevent excitation of the green fluorescent substance by the blue light emitting element as an emission source, blue light is obtained by the emission of the blue light emitting element, green light is obtained from the green fluorescent substance excited by the ultraviolet/violet light emitting element and red light is obtained by the emission of red light emitting element, independently from each other, and hence, light of an arbitrary color can be obtained by adjusting intensity of emission from each of the light emitting elements.

Figure 9:
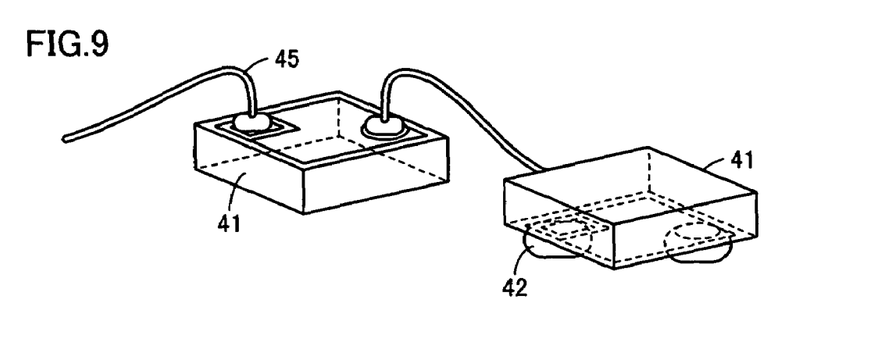
FIG. 9 illustrates arrangement of electrodes on the light emitting element.

In the embodiments of the LED device in accordance with the present invention described above, a light emitting element is mainly represented by one having electrodes in a P/N vertically opposite arrangement. A light emitting element having a structure with two electrodes arranged on an upper surface (left side of FIG. 9) or a flip-chip structure (right side of FIG. 9) may be used. Further, though the fluorescent substance is kneaded in a light transmitting resin, the fluorescent substance may be directly applied to the surface of the light emitting element to attain the same effect.

Figure 16A:
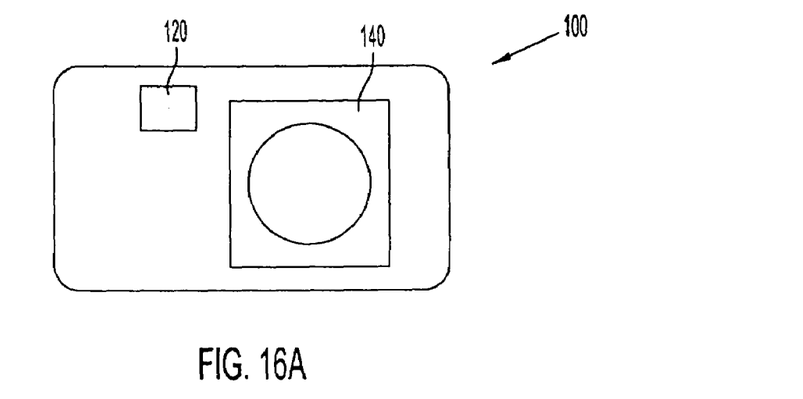
FIG. 16A depicts a digital camera which, in accordance with the present invention, employs the LED device of the present invention described as an auxiliary light source of a CCD or CMOS camera.

A digital camera 100, as show in FIG. 16A, in accordance with the present invention employs the LED device 120 of the present invention described above as an auxiliary light source of a CCD or CMOS camera 140. As the LED device as such can attain bright white light with good color reproduction characteristic, a digital camera employing the LED device as an auxiliary light source of a CCD or CMOS camera provides bright images with good color reproduction characteristic.

Figure 16B:
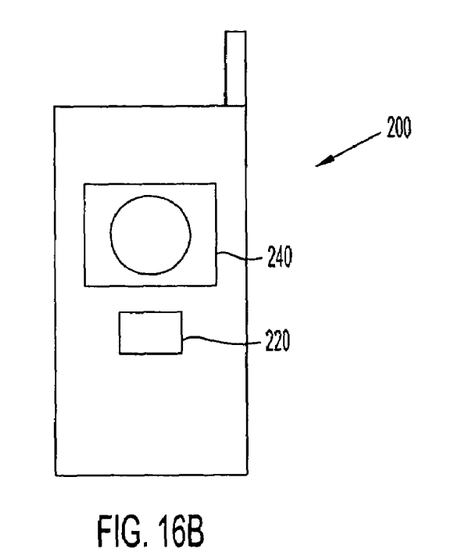
FIG. 16B depicts a portable telephone which, in accordance with the present invention, employs the LED device of the present invention described as an auxiliary light source of a CCD or CMOS camera.

A portable telephone 200, as shown in FIG. 16B, in accordance with the present invention employs the LED device 220 of the present invention described above as an auxiliary light source of a CCD or CMOS camera 240. As the LED device as such can attain bright white light with good color reproduction characteristic, a display of a portable telephone employing the LED device as an auxiliary light source of a CCD or CMOS camera provides bright images with good color reproduction characteristic. Further, as an arbitrary color can be obtained by adjusting intensity of emission of each of the light emitting elements, a function of displaying incoming call mode may be attained, in addition to the function of providing white light as an auxiliary light source.

Figure 16C:
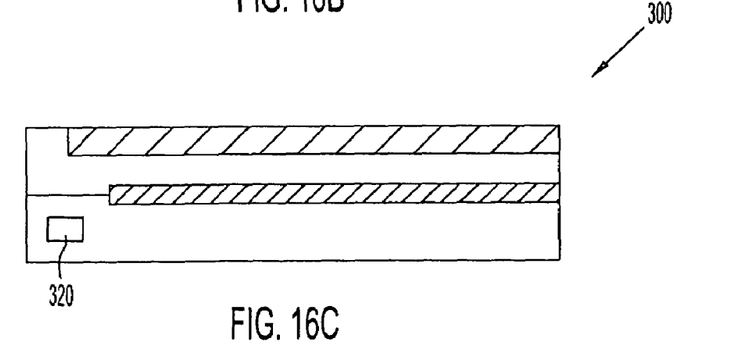
FIG. 16C depicts an LCD apparatus which, in accordance with the present invention, employs the LED device of the present invention described as a backlight source.

An LCD apparatus 300 as shown in FIG. 16C, in accordance with the present invention employs the LED device 320 of the present invention described above as a backlight source. As the LED device as such can attain bright white light with good color reproduction characteristic, the LCD apparatus employing the LED device as a backlight source provides bright images with good color reproduction characteristic.

In the figures referred to above, green fluorescent substance 16 is represented by a hexagon and red fluorescent substance is represented by a triangle. These shapes are simply used for distinction and do not represent actual shapes. Actually, these fluorescent substances are in the form of powders with each grain having approximately spherical shape.

EXAMPLES

In the following, examples of the LED device in accordance with the present invention will be specifically described.

Example 1

Referring to FIGS. 1A and 1B, InGaN on an SiC substrate having peak emission wavelength of 460 nm with electrodes arranged in the P/N vertically opposite arrangement was used as blue light emitting element 11, AlGaInP having peak emission wavelength of 624 nm with electrodes arranged in the P/N vertically opposite arrangement was used as red light emitting element 13, and $SrGa_2S_4$:Eu having average grain diameter of 8 μm was used as green fluorescent substance 16. Terminal electrodes 21a, 21b, 23a and 23b were of Cu alloy and coated with Au plating for better wire-bonding. As conductive adhesive 14, Ag paste was used, and Au wire was used for wire-bonding 15. As light transmitting resin 18, a thermosetting epoxy resin (specific gravity: 1.2) was used.

The LED device shown in FIGS. 1A and 1B was manufactured through the following steps. First, at prescribed positions of terminal electrodes 21a and 23a in a reflective case 19, n-electrodes of blue light emitting element 11 and red light emitting element 13 were adhered, using conductive adhesive 14. Thereafter, using bonding wire 15, p-electrodes of blue light emitting element 11 and red light emitting element 13 were connected to terminal electrodes 21b and 23b, respectively. In 1 g of liquid light transmitting resin, 0.05 g of $SrGa_2S_4$:Eu as the green fluorescent substance was kneaded, and poured into reflective case 19. Referring to FIG. 1B, the diameter L1 of the surface portion of the thus introduced light transmitting resin 18 was 3.81 mm, diameter L2 at the bottom portion was 2.6 mm, and the height H was 1.0 mm. After light transmitting resin was cured, portions of terminal electrodes 21a, 21b, 23a and 23b on the outside of reflective case were solder-plated, and the LED device was complete.

In the LED device, when only the red light emitting element 13 was driven with 35 mA, red light having the luminous intensity in axial direction of 1.1 cd was obtained, when only the blue light emitting element 11 was driven with 35 mA, blue-green light having the luminous intensity in axial direction of 1.25 cd was obtained because of the green fluorescent light from green fluorescent substance 16, and when both light emitting elements were driven with 35 mA, white light having the luminous intensity in axial direction of 2.35 cd and CIE chromaticity of (0.45, 0.37) was obtained Comparative Example 1

Figure 10:
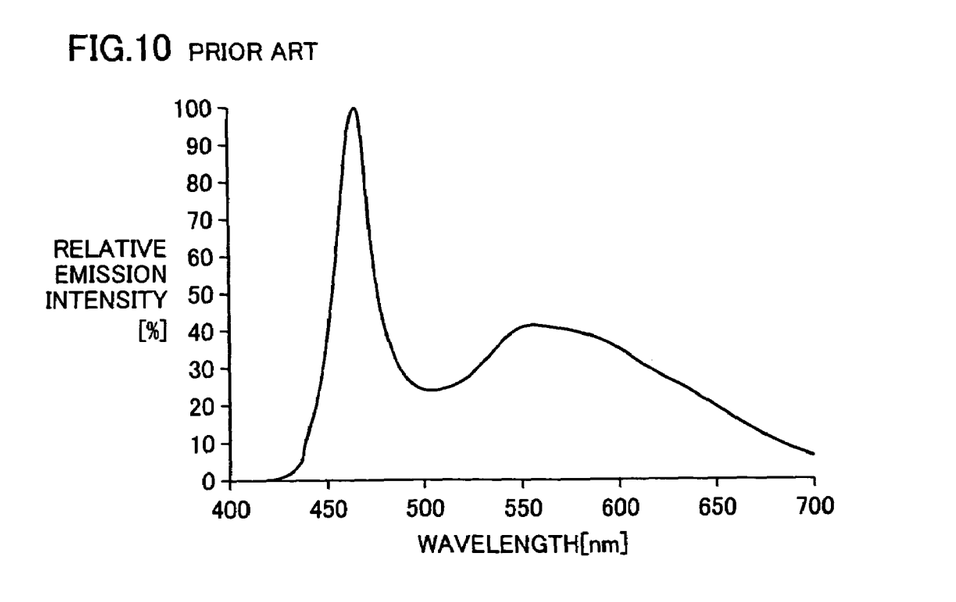
FIG. 10 represents emission spectrum of a conventional LED device including a blue light emitting element and a YAG based fluorescent substance.

A conventional LED device having a blue light emitting element and a YAG-based fluorescent substance was prepared, using a conventional YAG-based fluorescent substance in place of the green fluorescent substance and the red light emitting element of Example 1, and the blue light emitting element was driven with 35 mA. By the yellow light from YAG-based fluorescent substance excited by the blue light emitting element and the blue light from the blue light emitting element, white light having the luminous intensity in axial direction of 0.7 cd and CIE chromaticity of (0.32, 0.31) was obtained. Emission spectrum of the LED device is shown in FIG. 10.

Comparative Example 2

Figure 11:
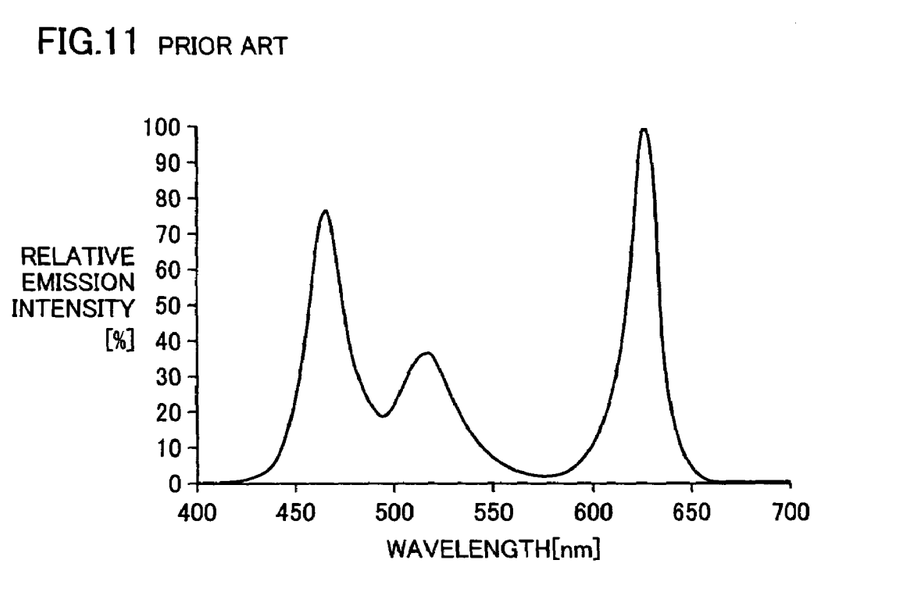
FIG. 11 represents emission spectrum of a conventional LED device including a blue light emitting element, a green light emitting element and a red light emitting element.

A conventional LED device including blue, red and green light emitting elements was fabricated. Here, the same light emitting elements as Example 1 were used for the blue and red light emitting elements, and InGaN having peak emission wavelength of 525 nm with electrodes arranged in the P/N vertically opposite arrangement was used as the green light emitting element. When only the blue light emitting element was driven with 35 mA, blue light having luminous intensity in axial direction of 0.34 cd was obtained, when only the red light emitting element 13 was driven with 35 mA, red light having the luminous intensity in axial direction of 1.1 cd was obtained, and when only the green light emitting element was driven with 35 mA, green light having the luminous intensity in axial direction of 1.1 cd was obtained. When all elements were driven with 35 mA, white light having the luminous intensity in axial direction of 2.6 cd and CIE chromaticity of (0.32, 0.28) was obtained. Emission spectrum of the LED device is shown in FIG. 11.

Example 2

Referring to FIGS. 2A and 2B, GaN having peak emission wavelength of 405 nm with electrodes arranged in the P/N vertically opposite arrangement was used as ultraviolet/violet light emitting element 12. Red light emitting element 13, green fluorescent substance 16, terminal electrodes 21$a$, 21$b$, 23$a$ and 23$b$, conductive adhesive 14, bonding wire 15 and light transmitting resin 18 were the same as those used in Example 1. An LED device was fabricated through similar steps as in Example 1.

Figure 12:
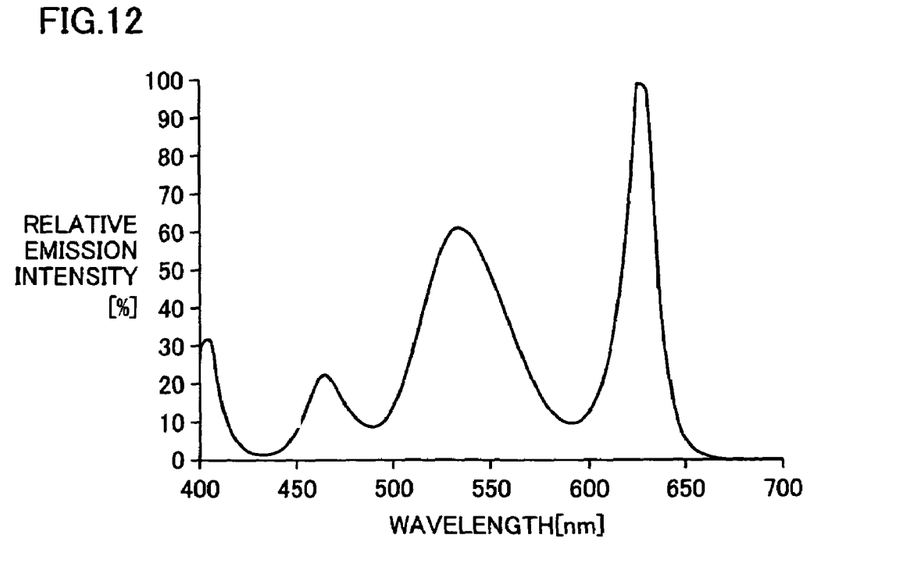
FIG. 12 represents emission spectrum of an LED device in accordance with the present invention.

In the LED device, when only the red light emitting element 13 was driven with 35 mA, red light having the luminous intensity in axial direction of 1.1 cd was obtained, when only the blue light emitting element 11 was driven with 35 mA, blue-green light having the luminous intensity in axial direction of 1.1 cd was obtained because of the green fluorescent light from green fluorescent substance 16, when only the ultraviolet/violet light emitting element 12 was driven with 35 mA, green light having the luminous intensity in axial direction of 2.0 cd was obtained through green fluorescent substance 16, and when all light emitting elements were driven with 35 mA, greenish white light having the luminous intensity in axial direction of 4.2 cd and CIE chromaticity of (0.40, 0.46) was obtained. Emission spectrum of the LED device is shown in FIG. 12.

Example 3

An LED device was fabricated in the similar manner as in Example 2, except that $SrAl_2O_4$:Eu was used in place of $SrGa_2S_4$:Eu as green fluorescent substance 16 and that in 1 g of light transmitting resin, 0.1 g of green fluorescent substance was kneaded.

Figure 13:
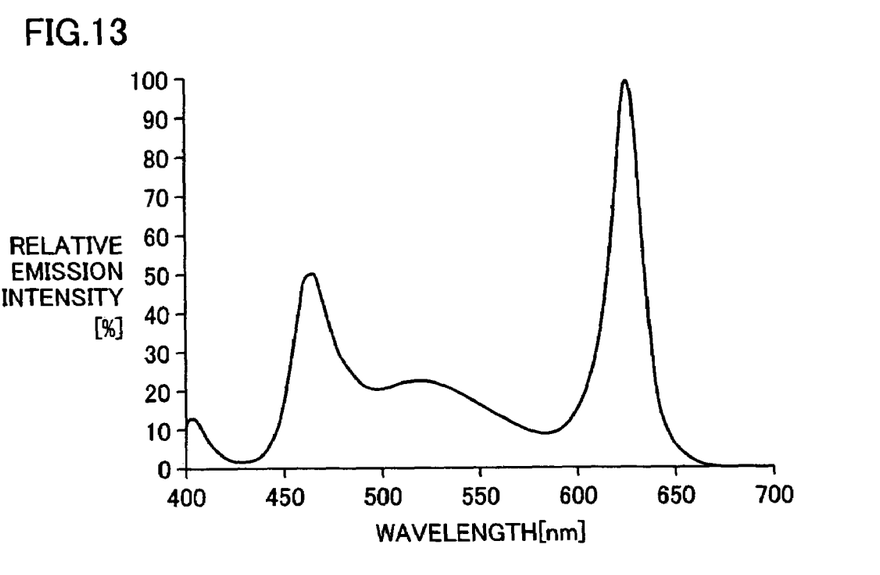
FIG. 13 represents emission spectrum of anther LED device in accordance with the present invention.

In the LED device, when only the red light emitting element 13 was driven with 35 mA, red light having the luminous intensity in axial direction of 1.1 cd was obtained, when only one blue light emitting element was driven with 35 mA, blue light having the luminous intensity in axial direction of 0.5 cd was obtained with the green fluorescent substance being hardly excited, when only the ultraviolet/violet light emitting element 12 was driven with 35 mA, green light having the luminous intensity in axial direction of 1.4 cd was obtained through green fluorescent substance 16, and when all light emitting elements were driven with 35 mA, white light having the luminous intensity in axial direction of 3.0 cd and CIE chromaticity of (0.37, 0.31) was obtained. Emission spectrum of the LED device is shown in FIG. 13.

Example 4

An LED device including two blue light emitting elements and one red light emitting element and green fluorescent substance was fabricated, using a blue light emitting element (not shown) in place of ultraviolet/violet light emitting element 12 of FIGS. 2A and 2B. In this example, $SrGa_2S_4$:Eu was used as green fluorescent substance.

Figure 14:
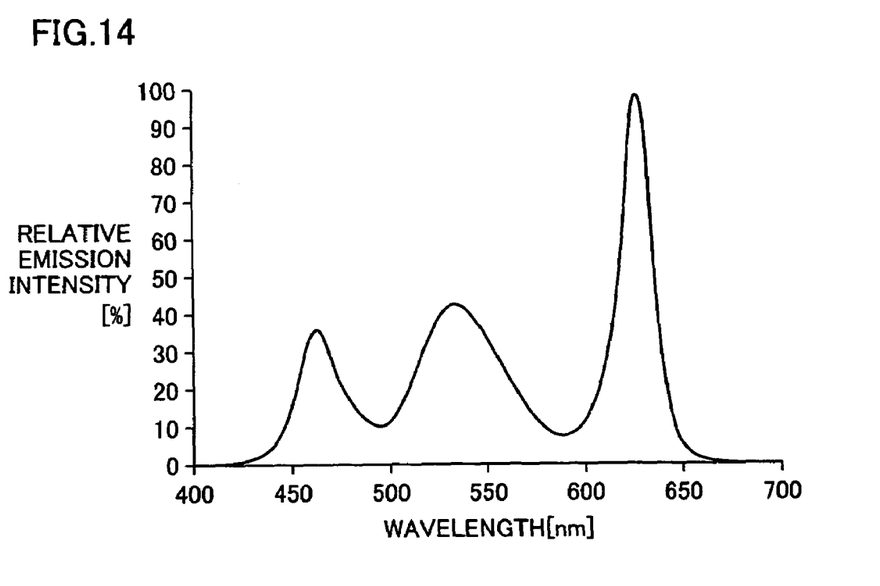
FIG. 14 represents emission spectrum of still another LED device in accordance with the present invention.

In the LED device, when only the red light emitting element 13 was driven with 35 mA, red light having the luminous intensity in axial direction of 1.1 cd was obtained, when only the blue light emitting element 11 was driven with 35 mA, blue-green light having the luminous intensity in axial direction of 1.25 cd was obtained because of the green fluorescent light from green fluorescent substance 16, and when all light emitting elements were driven with 35 mA, white light having the luminous intensity in axial direction of 3.6 cd and CIE chromaticity of (0.38, 0.39) was obtained. Emission spectrum of the LED device is shown in FIG. 14.

Example 5

Figure 15:
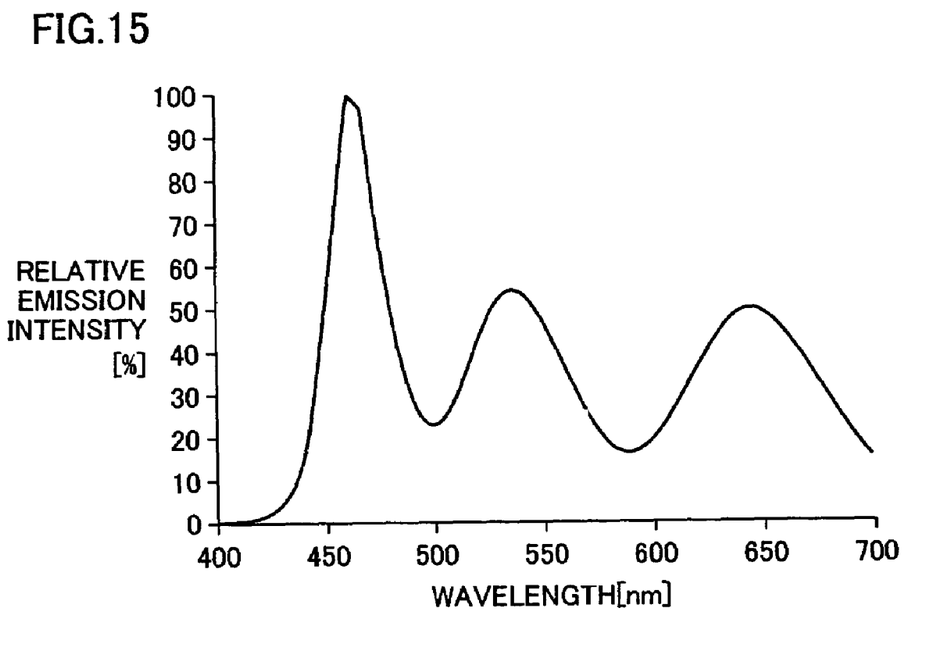
FIG. 15 represents emission spectrum of a further LED device in accordance with the present invention.

An LED device including blue light emitting element 11, green fluorescent substance 16 of $SrGa_2S_4$:Eu and red fluorescent substance 17 of SrCaS:Eu was fabricated, as shown in FIGS. 3A and 3B. The LED device was fabricated in the similar manner as in Example 1 except that only the blue light emitting element 11 was fixed as the light emitting element on terminal electrode 21$a$ and connected to terminal electrode 21$b$ by bonding wire 15, and that green fluorescent substance 16 as well as red fluorescent substance 17 were kneaded in light transmitting resin 18. Here, in 1 g of light transmitting resin, 0.02 g of green fluorescent substance and 0.03 g of red fluorescent substance were kneaded. Emission spectrum of the LED device is shown in FIG. 15.

The devices having three light emitting elements are compared. Luminous intensity in axial direction of LED devices of Examples 2 to 4 are 4.2 cd, 3.0 cd and 3.6 cd, respectively, larger than the luminous intensity of 2.6 cd of the LED device of Comparative Example 2. When emission spectra of the LED devices are compared, it can be seen that emission spectra of LED devices of Examples 2 to 4 (FIGS. 12 to 14) are wider in green range (500 nm to 580 nm) than that of the LED device of Comparative Example 2 (FIG. 11), which means that color reproduction characteristic is improved. This improvement is realized by the LED device having the structure of FIGS. 1A and 1B or 2A and 2B in which green fluorescent substance is used in place of a green light emitting element of the conventional LED device including blue, green and red light emitting elements.

As to the devices having one light emitting element, as compared with light emission spectrum of the LED device of Comparative Example 1 (FIG. 10), light emission spectrum of the LED device of Example 5 (FIG. 15) contains blue light, green light and red light in good balance, realizing better color reproduction characteristic, and the spectrum well matches with sensitivity characteristic of a CCD or color filter characteristic of an LCD apparatus. This is realized by the LED device having the structure shown in FIGS. 3A and 3B in which green fluorescent substance and red fluorescent substance are used in place of the YAG-based fluorescent substance of the conventional LED device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An LED device, at least comprising:

a blue light emitting element having peak emission wavelength of 420 nm to 480 nm, a green fluorescent substance having peak wavelength of fluorescent spectrum in the range of 500 nm to 580 nm with the emission of said blue light emitting element, and a red light emitting element having peak emission wavelength of 600 nm to 670 nm, wherein said green fluorescent substance having peak wavelength of fluorescent spectrum in the range of 500 nm to 580 nm is formed of at least two fluorescent substances, and wherein the fluorescent substances are selected from the group consisting of $SrGa_2S_4$:Eu; $RMg_2Al_{16}O_{27}$:Eu, Mn (R is at least one element selected from Sr and Ba); $RMgAl_{10}O_{17}$:Eu, Mn (R is at least one element selected from Sr and Ba); ZnS:Cu; $SrAl_2O_4$:Eu; $SrAl_2O_4$:Eu, Dy; ZnO:Zn; $Zn_2Ge_2O_4$:Mn; $Zn_2SiO_4$:Mn; and $Q_3MgSi_2O_8$:Eu, Mn (Q is at least one element selected from Sr, Ba and Ca).

2. The LED device according to claim 1, wherein the fluorescent substance has light transmitting characteristic and refractive index n of n>1, and said fluorescent substance is coated with a heat-resistant, water-proof and light transmitting coating.

3. The LED device according to claim 1, wherein grain size of the fluorescent substance is at most 20 μm.

4. A digital camera using, as an auxiliary light source of a CCD or CMOS camera, an LED device at least including: a blue light emitting element having peak emission wavelength of 420 nm to 480 nm, a green fluorescent substance having peak wavelength of fluorescent spectrum in the range of 500 nm to 580 nm with the emission of said blue light emitting element, and a red light emitting element having peak emission wavelength of 600 nm to 670 nm, wherein said green fluorescent substance having peak wavelength of fluorescent spectrum in the range of 500 nm to 580 nm is formed of at least two fluorescent substances.

5. A portable telephone using, as an auxiliary light source of a CCD or CMOS camera, an LED device at least including: a blue light emitting element having peak emission wavelength of 420 nm to 480 nm, a green fluorescent substance having peak wavelength of fluorescent spectrum in the range of 500 nm to 580 nm with the emission of said blue light emitting element, and a red light emitting element having peak emission wavelength of 600 nm to 670 nm, wherein said green fluorescent substance having peak wavelength of fluorescent spectrum in the range of 500 nm to 580 nm is formed of at least two fluorescent substance.

6. An LCD apparatus using, as a backlight source, an LED device at least including: a blue light emitting element having peak emission wavelength of 420 nm to 480 nm, a green fluorescent substance having peak wavelength of fluorescent spectrum in the range of 500 nm to 580 nm with the emission of said blue light emitting element, and a red light emitting element having peak emission wavelength of 600 nm to 670 nm, wherein said green fluorescent substance having peak wavelength of fluorescent spectrum in the range of 500 nm to 580 nm is formed of at least two fluorescent substances.

* * * * *